US012663491B2

(12) United States Patent
Stich et al.

(10) Patent No.: US 12,663,491 B2
(45) Date of Patent: Jun. 23, 2026

(54) REDUCING AND CORRECTING MAGNETIC FIELD GRADIENT DEVIATIONS

(71) Applicant: Siemens Healthcare GmbH, Erlangen (DE)

(72) Inventors: Manuel Stich, Parkstein (DE); Philipp Puls, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 452 days.

(21) Appl. No.: 18/142,154

(22) Filed: May 2, 2023

(65) Prior Publication Data

US 2023/0358834 A1 Nov. 9, 2023

(30) Foreign Application Priority Data

May 3, 2022 (EP) ..................................... 22171264

(51) Int. Cl.
*G01R 33/389* (2006.01)
*G01R 33/565* (2006.01)

(52) U.S. Cl.
CPC ..... *G01R 33/389* (2013.01); *G01R 33/56572* (2013.01)

(58) Field of Classification Search
CPC ......................... G01R 33/389; G01R 33/56572
See application file for complete search history.

(56) References Cited

U.S. PATENT DOCUMENTS

| | | | | |
|---|---|---|---|---|
| 8,339,138 | B2 * | 12/2012 | Parker .................. | G01R 33/385 |
| | | | | 324/318 |
| 2006/0255807 | A1 * | 11/2006 | McBride ............ | G01R 33/3852 |
| | | | | 324/322 |
| 2019/0033405 | A1 * | 1/2019 | Fath .................... | G01R 33/3852 |
| 2020/0333410 | A1 | 10/2020 | Ruyters et al. | |
| 2021/0106251 | A1 | 4/2021 | Lips et al. | |

(Continued)

FOREIGN PATENT DOCUMENTS

| | | | | | |
|---|---|---|---|---|---|
| CA | | 3129551 | A1 * | 5/2018 | ......... G01R 33/5608 |
| DE | 102018212858 | A1 * | 2/2020 | ............. G01K 13/00 |

(Continued)

OTHER PUBLICATIONS

Campbell-Washburn, Adrienne E., et al. "Real-time distortion correction of spiral and echo planar images using the gradient system impulse response function." Magnetic resonance in medicine 75.6 (2016): 2278-2285.

(Continued)

*Primary Examiner* — Catherine T. Rastovski
*Assistant Examiner* — Nyla Gavia
(74) *Attorney, Agent, or Firm* — Lempia Summerfield Katz LLC

(57) ABSTRACT

In a method for reducing and/or correcting deviations from a target gradient of a magnetic field gradient created by an MR system input data is provided for a trained function trained by a machine-learning algorithm, wherein the input data comprises information about the target gradient of the MR system. The trained function further creates output data with the aid of the input data. The deviations from the target gradient of the magnetic field gradient created by the MR system are reduced and/or corrected with the aid of the output data created.

8 Claims, 6 Drawing Sheets

(56) References Cited

U.S. PATENT DOCUMENTS

| | | |
|---|---|---|
| 2021/0272335 A1 | 9/2021 | Huang et al. |
| 2022/0043090 A1 | 2/2022 | Stich et al. |
| 2022/0043092 A1 | 2/2022 | Stich et al. |
| 2022/0043093 A1 | 2/2022 | Stich et al. |
| 2022/0196771 A1 | 6/2022 | Zur et al. |
| 2023/0086826 A1 | 3/2023 | Stich et al. |

FOREIGN PATENT DOCUMENTS

| | | | |
|---|---|---|---|
| DE | 102020209787 A1 | 2/2022 | |
| EP | 3543722 A1 * | 9/2019 | ........... H03F 1/3241 |
| WO | 2020217098 A2 | 10/2020 | |

OTHER PUBLICATIONS

Duyn, Jeff H., et al. "Simple correction method for k-space trajectory deviations in MRI." Journal of Magnetic Resonance 132.1 (1998): 150-153.

B. E. Dietrich et al. "Thermal Variation and Temperature-Based Prediction of Gradient Response", Institute of Biomedical Engineering; No. 79, Apr. 7, 2017 (Apr. 7, 2017).

Clayton, David B., et al. "1H spectroscopy without solvent suppression: characterization of signal modulations at short echo times." Journal of magnetic resonance 153.2 (2001): 203-209.

Dietrich, B.E. et al.: "A field camera for MR sequence monitoring and system anal-ysis", (2016) Magn. Reson. Med., 75: 1831-1840.

Foerster, B. et. al., "Magnetic field shift due to mechanical vibration in functional magnetic resonance imaging", Magn Reson Med 54:1261-1267, 2005.

Hwang, San-Chao et al: "Fast eddy current compensation by feedback linearization neural networks: Applications in diffusion-weighted echo planar imaging", Concepts in Magnetic Resonance Part B: Magnetic Resonance Engineering, Bd. 29B, Nr. 1, Feb. 1, 2006 (Feb. 1, 2006), Seiten 1-8.

Jehenson, P., M. Westphal, and N. Schuff. "Analytical method for the compensation of eddy-current effects induced by pulsed magnetic field gradients in NMR systems." Journal of Magnetic Resonance (1969) 90.2 (1990): 264-278.

Nussbaum J. et a..: "Nonlinearity and thermal effects in gradient chains: a cascade analysis based on current and field sensing" In: Proceedings of the 27th Annual Meeting of the ISMRM, Montreal, Canada, 2019. p. 213.

Peters, D. C. et. al., "Undersampled projection reconstruction applied to MR angiography", Mag Reson Med;43:91-101, 2000.

Rahmer, Jürgen et al. "Rapid acquisition of the 3D MRI gradient impulse response function using a simple phantom measurement", 2019, Magnetic Resonance in Medicine, DOI: 10.1002/mrm.27902.

Rahmer, Jürgen, et al. "Non-Cartesian k-space trajectory calculation based on concurrent reading of the gradient amplifiers' output currents." Magnetic Resonance in Medicine 85.6 (2021): 3060-3070.

Stich, Manuel, et al. "Gradient waveform pre-emphasis based on the gradient system transfer function." Magnetic resonance in medicine 80.4 (2018): 1521-1532.

Stich, Manuel, et al. "The temperature dependence of gradient system response characteristics." Magnetic Resonance in Medicine 83.4 (2020): 1519-1527.

Vannesjo, S. Johanna, et al. "Image reconstruction using a gradient impulse response model for trajectory prediction." Magnetic resonance in medicine 76.1 (2016): 45-58.

Vannesjo, Signe J., et al. "Gradient system characterization by impulse response measurements with a dynamic field camera." Magnetic resonance in medicine 69.2 (2013): 583-593.

Wech, Tobias, et al. "Using self-consistency for an iterative trajectory adjustment (SCITA)." Magnetic resonance in medicine 73.3 (2015): 1151-1157.

Wu, Y. et. al., "Gradient induced acoustic and magnetic field fluctuations in a 4 T wholebody MR imager", Magn Reson Med, 44:532-536, 2000.

Liu, Qi, H. Nguyen, Xucheng Zhu, Xiaohui Zhai, Bo Li, Jian Xu, and Weiguo Zhang. "Gradient waveform prediction using deep neural network." In Proc Intl Soc Mag Reson Med, vol. 30, p. 0639. 2022.

* cited by examiner

P

PC

M

MC

REDUCING AND CORRECTING MAGNETIC FIELD GRADIENT DEVIATIONS

CROSS REFERENCE TO RELATED APPLICATIONS

This application claims the benefit of EP 22171264.9 filed on May 3, 2022, which is hereby incorporated by reference in its entirety.

FIELD

Embodiments relate to a method and an apparatus for reducing and/or correcting deviations from a target gradient of a magnetic field gradient created by a magnetic resonance system (MR system).

BACKGROUND

In magnetic resonance tomography a number of magnetic fields are overlaid. In this way a high background magnetic field is created, that leads to the nuclei aligning themselves, because of the nuclear spin, along the background magnetic field. Further, with the aid of a gradient system, a magnetic field gradient is created, that defines the spatially-dependent magnetic resonant frequency (Larmor frequency). Furthermore, radio-frequency excitations are created, that align the nuclear spins of specific, resonantly excited nuclei with a flip angle relative to the background magnetic field. With already excited nuclear spins, these may be aligned in another angular position, and be brought into an initial state parallel to the background magnetic field. In this process, referred to as relaxation, a radio-frequency radiation is created, that is measured. What is known as the raw data is created by this.

The magnetic resonance radiation is recorded in the spatial frequency space (k-space). Finally, by evaluation of the raw data, image data of the object to be examined may be created.

During the measurement predetermined pulse sequences may be specifically emitted that involves sequences of radio-frequency pulses and of magnetic field gradients.

The accuracy of the gradient system used has a great influence on the image quality. Non-cartesian recordings, for example with radial or spiral-shaped trajectories or single-shot Echo Planar Imaging (EPI), make high demands in this case on the temporal accuracy of the magnetic field gradients.

For a number of reasons however deviations from a target gradient (nominal magnetic field gradient) of a created (emitted) magnetic field gradient may occur. Important influencing factors are factors such as eddy currents, timing and amplifier errors and also field fluctuations, that are caused by mechanical vibrations during switching of magnetic field gradients. Thermal fluctuations of hardware components may further have an influence, such as of gradient coils, of the electronics of the gradient amplifier or the like. All the effects lead to deviations from the desired target gradient or to errors in the detected signal and ultimately to artifacts in the image.

When the deviations are known precisely the actual magnetic field gradient may be specified and used for image reconstruction. As an alternative the magnetic field gradient actually emitted may be measured. The deviations determined may however also be used for pre-compensation of possible deviations of the magnetic field gradients.

The behavior of the gradient system in this case is also dependent on temperature. The emission of a magnetic field gradient with the gradient coils leads to a heating up of the system. This change in temperature in its turn influences the transmission behavior of the dynamic gradient system.

Small field probes or a dynamic field camera may be used in order to measure the emitted magnetic field gradients that deviate from the target gradient, as described in Duyn et al., "Simple correction method for k-space trajectory deviations in MRI", J. Magn. Reson. 1998, 132, pages 150-153. The measured magnetic field gradient may then be used for the image reconstruction.

One possible correction during image reconstruction is described for example in Campbell-Washburn et al., "Real-time distortion correction of spiral and echo planar images using the gradient system impulse response function", Magn. Reson. Med., 75: 2278-2285, 2016.

In this case the trajectory must be newly acquired for the reconstruction when specific sequence or image parameters change. This makes the use of this approach more difficult for a medical product in the everyday clinical routine.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide a reduction or correction of deviations from a target gradient of a magnetic field gradient created by an MR system that is able to be employed in the day-to-day clinical routine.

This is achieved by a method and an apparatus for reducing and/or correcting deviations from a target gradient of a magnetic field gradient created by an MR system, by a method for creating a trained function and by an MR system.

In accordance with a first aspect, embodiments relate to a method for reducing and/or correcting deviations from a target gradient of a magnetic field gradient created by an MR system. Input data for a trained function trained by a machine-learning algorithm is provided. The input data includes information about the target gradient of the MR system. The trained function, with aid of the input data, further creates output data. The deviations from the target gradient of the magnetic field gradient created by the MR system are reduced and/or corrected with the aid of the output data created.

In accordance with a second aspect, embodiments relate to a computer-implemented method for creation of a trained function. In this method training data is provided, that includes at least one target gradient of an MR system with associated magnetic field gradients actually created by the MR system. The function is trained by a machine-learning algorithm, based on the training data. The function is trained to output output data, that is able to be used for reducing and/or correcting deviations of magnetic field gradients created by the MR system from the target gradient. The trained function is provided.

In accordance with a third aspect, embodiments relate to an apparatus for reducing and/or correcting deviations from a target gradient of a magnetic field gradient created by an MR system. The apparatus includes a computing facility, that is configured to provide input data to a function trained by a machine-learning algorithm. The input data includes information about the target gradient of the MR system. The computing facility is further configured to create output data by the trained function with the aid of the input data. The apparatus further includes a reduction/correction facility, that is configured, with the aid of the output data of the trained function, to reduce and/or to correct the deviations from the target gradient of the magnetic field gradient created by the MR system.

In accordance with a fourth aspect an embodiment relates to an MR system with an amplifier, that is configured to amplify an amplifier input signal and to output it as an amplifier output signal. The MR system further includes a gradient coil, that is configured, with the aid of the amplifier output signal, to create a magnetic field gradient. The MR system includes an apparatus in accordance with the third aspect, that is configured to correct and/or to reduce deviations from a target gradient of the magnetic field gradient created by the gradient coils.

In accordance with a fifth aspect, embodiments relate to a computer program product with executable program code, that is configured, when executed on a control apparatus of the MR system in accordance with the fourth aspect, to carry out the method for reducing and/or correcting deviations from a target gradient of a magnetic field gradient created by the MR system in accordance with the first aspect or the method for creation of a trained function in accordance with the second aspect.

In accordance with a sixth aspect, embodiments relate to a non-volatile, computer-readable memory medium with executable program code, that is configured, when executed on a control apparatus of the MR system in accordance with the fourth aspect, to carry out the method for reducing and/or correcting deviations of a magnetic field gradient created by the MR system from a target gradient in accordance with the first aspect or the method for creation of a trained function in accordance with the second aspect.

The reduction and/or correction of the deviations from the target gradient of the magnetic field gradient created by the MR system is undertaken by using a trained function (i.e. a trained algorithm). This provides it to be advantageously assumed that the amplifier and the gradient coil of the MR system exhibit an essentially linear and/or time-invariant behavior. The trained function in this case is well suited to dealing with the non-linearities.

Embodiments may provide a simple and quick to carry out and/or precise method for correction of noise effects. The trained function is suitable for being applied to a patient during a magnetic resonance measurement, so that time-consuming and/or computing-intensive subsequent correction methods may be avoided.

A target gradient is understood as a desired magnetic field gradient (nominal magnetic field gradient), that may differ from the actually emitted magnetic field gradient.

In an embodiment of the method for reducing and/or correcting deviations from a target gradient of a magnetic field gradient created by an MR system, the MR system includes an amplifier, that amplifies an amplifier input signal and outputs it as an amplifier output signal. The MR system includes a gradient coil, that creates the magnetic field gradients with the aid of the amplifier output signal. The trained function determines a corrected amplifier input signal or a correction signal for correction of the amplifier input signal. The amplifier output signal is created as a function of the corrected amplifier input signal or of the correction signal. The trained function may create the amplifier input signal directly. As an alternative a correction signal may be created that may be combined with an amplifier input signal created by a control facility. To this end the combining may be undertaken by at least one of factorization, subtraction, weighting and exponentiation. The electrical input signal may be adjusted accordingly in this case.

The use of the corrected amplifier input signal or of the correction signal provides a pre-emphasis to be carried out, so that the deviations from the target gradient of the magnetic field gradient created by the MR system may advantageously be reduced.

In an embodiment of the method for reducing and/or correcting deviations from a target gradient of a magnetic field gradient created by an MR system, the trained function determines an estimation for a magnetic field gradient created by the MR system. This information may be taken into account for an evaluation of assumed measurement data, for example within the framework of a post-correction method. This may for example include a correction of the influence of the deviation from the target gradient in the image data during the image reconstruction, as described for example in Campbell-Washburn et al., "Real-time distortion correction of spiral and echo planar images using the gradient system impulse response function".

There may be provision for the trained function to be trained to determine or to estimate the deviation with the aid of the input signal or target gradient for example. Instead of or in addition to the pre-emphasis, i.e., to measures for the correction of the amplifier output signal, a corresponding subsequent correction method (post-processing) may be undertaken.

In an embodiment of the method for reducing and/or correcting deviations from a target gradient of a magnetic field gradient created by an MR system, a gradient characterization function is determined with the aid of the estimation for the magnetic field gradients created by the MR system. The gradient characterization function may include a gradient system transmission function (GSTF).

In an embodiment of the method for reducing and/or correcting deviations from a target gradient of a magnetic field gradient created by an MR system, a corrected amplifier input signal or a correction signal for correction of the amplifier input signal is created with the aid of the gradient characterization function. The corrected amplifier input signal is applied to the amplifier. The gradient characterization function may thus be used for a pre-emphasis.

In an embodiment of the method for reducing and/or correcting deviations from a target gradient of a magnetic field gradient created by an MR system, the MR system creates raw data by the created magnetic field gradient. MR image data is created with the aid of the raw data and the gradient characterization function. The gradient characterization function may thus be used for a post-correction method.

In an embodiment of the method for reducing and/or correcting deviations from a target gradient of a magnetic field gradient created by an MR system, the input data for the trained function further includes an amplifier input signal of an amplifier of the MR system. The amplifier amplifies the amplifier input signal and outputs it as an amplifier output signal to a gradient coil of the MR system, that creates a magnetic field gradient with the aid of the amplifier output signal. The input data may further, in addition or as an alternative, include the measured amplifier output signal. The input data may further, in addition or as an alternative, include at least one measured temperature of the amplifier and/or of a gradient coil. The input data may further, in addition or as an alternative, include magnetic field gradients measured by the MR system. The input data may further, in addition or as an alternative, include an imaging region, for example a diagnostically relevant region of a patient's body. The input data may further, in addition or as an alternative, include information regarding an object examined by the MR system. This may for example involve patient information, such as for example size, weight, gender or age of the patient being examined. The body of the patient being examined may in this case have an influence on the emitted magnetic field gradients. This may result in distortions. Such influences may be trained into the trained function, so that it may compensate for these kinds of influences. Taking into account this additional input data enables the reduction and/or correction of the deviations to be improved once again.

In an embodiment of the computer-implemented method for creation of the trained function, the trained function is created in such a way that, with the aid of the trained function, an estimation for a magnetic field gradient created by MR system may be determined, wherein with the aid of the estimation for the magnetic field gradients created by the MR system a gradient characterization function may be determined. The trained function may itself also create and output the estimation for the magnetic field gradient created by the MR system.

The trained function may further be created in such a way that, with the aid of the gradient characterization function a corrected amplifier input signal or a correction signal for correction of the amplifier input signal may be created, i.e., for the pre-emphasis described above. As an alternative the trained function may be created in such a way that MR image data may be created with the aid of raw data, that is created by the MR system by the created magnetic field gradients and with the aid of the gradient characterization function, i.e., for the post-processing method described above.

In an embodiment of the computer-implemented method for creation of the trained function, a time characteristic of the target gradient includes at least one of a rectangular waveform, a trapezoidal waveform, and a chirped pulse.

In an embodiment of the computer-implemented method for creation of the trained function, the training data includes information about the target gradient of the MR system and associated magnetic field gradients actually created by the MR system for a plurality of different temperatures of at least one component of the MR system, and/or different frequencies, different pulse widths, different amplitudes, and/or different slew rates of magnetic field gradients. The magnetic field gradients are defined via their gradient amplitude, the gradient pulse duration and via the slew rate or the first derivation of the pulse shape dG/dt of the magnetic field gradients, usually also referred to as the slew rate. Thus different magnetic field gradients and/or peripheral conditions of a magnetic field gradient may be trained into a trained function. Possible peripheral conditions might include a temperature (such as a temperature of a gradient or an ambient temperature), the duration of a magnetic field gradient and/or the duration and/or sequence of a pulse sequence of magnetic field gradients.

In an embodiment of the computer-implemented method for creation of the trained function, the training data for a pair consisting of a target gradient and an associated actual magnetic field gradient created by the MR system further includes at least one of an amplifier input signal of an amplifier of the MR system, wherein the amplifier amplifies the amplifier input signal and outputs it as an amplifier output signal to gradient coils of the MR system, that create a magnetic field gradient with the aid of the amplifier output signal, the amplifier output signal, at least one measured temperature of the amplifier and/or of the gradient coil, a measured magnetic field gradient created by the MR system, an imaging region, and information regarding an object being examined by the MR system.

In an embodiment of the computer-implemented method for creation of the trained function, the trained function is based on an artificial neural network. A neural network may be a deep neural network, a convolutional neural network or a convolutional deep neural network. Over and above this a neural network may be an adversarial network, a deep adversarial network and/or a generative adversarial network.

DETAILED DESCRIPTION

Figure 1:
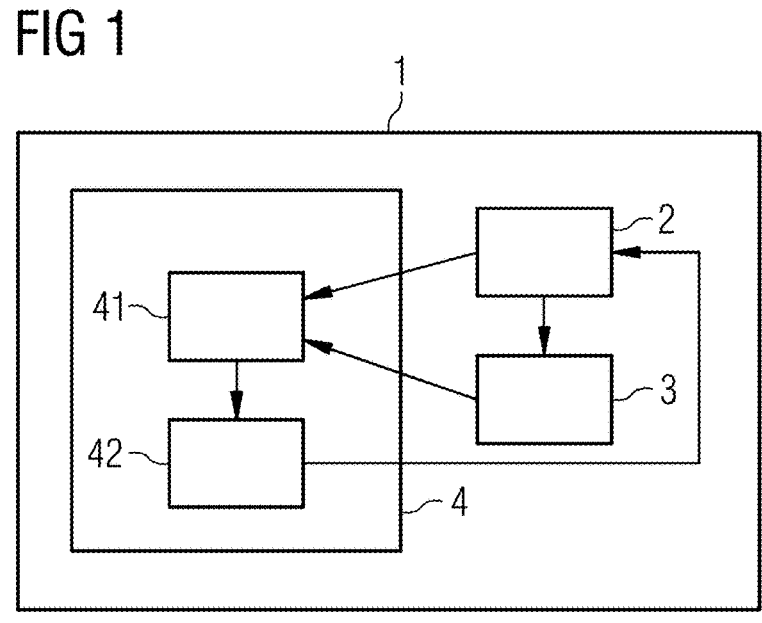
FIG. 1 depicts a schematic block diagram of an MR system with an apparatus for reducing and/or correcting deviations from a target gradient of a magnetic field gradient created by the MR system according to an embodiment.

FIG. 1 depicts a schematic block diagram of an embodiment of a magnetic resonance system 1 with an apparatus 4 for reducing and/or correcting deviations from a target gradient of a magnetic field gradient created by the MR system 1.

The MR system 1 in this figure includes an amplifier 2, that amplifies an amplifier input signal and outputs it as an amplifier output signal. The MR system 1 further includes a gradient coil 3, that creates a magnetic field gradient with the aid of the amplifier output signal. The MR system 1 may have a plurality of gradient coils 3.

The apparatus 4 includes a computing facility 41. This is configured to provide input data to a function trained by a machine-learning algorithm. The input data includes information about the target gradient of the MR system 1. The information about the target gradient may involve a designation of the target gradient, the amplifier input signal or amplifier output signal or the like. It is likewise conceivable for the information about the target gradient to include a time characteristic of the target gradient, a frequency of the target gradient, a pulse width of the target gradient and/or a slew rate of the target gradient. The designation of the target gradient may for example be a numerical value, a string (for example a code name or acronym) or an identifier in in any given data format.

The input data for the trained function may further for example include an amplifier input signal of the amplifier 2. The input data may further include the measured amplifier output signal.

It is likewise possible to take temperature dependencies into account. To this end the input data may include at least one measured temperature of the amplifier 2 and/or of the gradient coil 3. Through this a dependency on the temperature of the amplifier 2 or of the gradient coil 3 is trained into the trained function.

The input data may further include a measured magnetic field gradient created by the MR system 1. An imaging region may further be included, for example a diagnostically relevant region of a patient's body. The imaging region may for example be characterized by a diagnostically relevant region of the body of a patient to be examined. The diagnostically relevant region of the body may for example predetermine or define a positioning of the patient relative to the MR system 1 during a magnetic resonance examination or a scan. The positioning of the patient relative to the MR system 1 may in its turn have an influence on the emitted magnetic field gradient (for example a distortion), that may be trained into the trained function. Information regarding an object being examined by the MR system 1 may likewise be part of the input data. This may involve patient information.

The trained function creates output data with the aid of the input data. The apparatus 4 further includes a reduction/correction facility 42 that, with the aid of the output data of the trained function 81, reduces and/or corrects the deviations from the target gradient of the magnetic field gradient created by the MR system 1.

The apparatus 4 may include software and/or hardware components, such as central processing units (CPUs), graphics processing units (GPUs), microcontrollers, integrated circuits (ICs), Application-Specific Integrated Circuits (ASICs), Field Programmable Gate Arrays (FPGAs), Programmable Logic Circuits (PLDs), Digital Signal Processors (DSPs) or the like. Individual units of the apparatus 4, such as the computing facility 41 and the reduction/correction facility 42, may be designed as the same hardware component and/or software component or as separate hardware components and/or software components. At least parts of the computation may also be carried out on a remote server, i.e., such as in a Cloud.

In accordance an embodiment the trained function may determine a corrected amplifier input signal or a correction signal for correction of the amplifier input signal. The amplifier input signal may be created as a function of the corrected amplifier input signal or of the correction signal. The trained function may thus be used in a pre-emphasis scenario and time- and/or computing-intensive post-processing steps, for example the computation of a GSTF or the image reconstruction as a function of the GSTF, may be avoided. This pre-emphasis may be employed for gradient pulses and/or gradient pulse sequences, that are applied during a magnetic resonance examination or a scan of a patient.

The reduction/correction facility 42 may be configured to correct the amplifier input signal by a circuit, such as for example an ASIC, PLD, FPGA, or DSP, or to transfer it to the amplifier 2.

Figure 2:
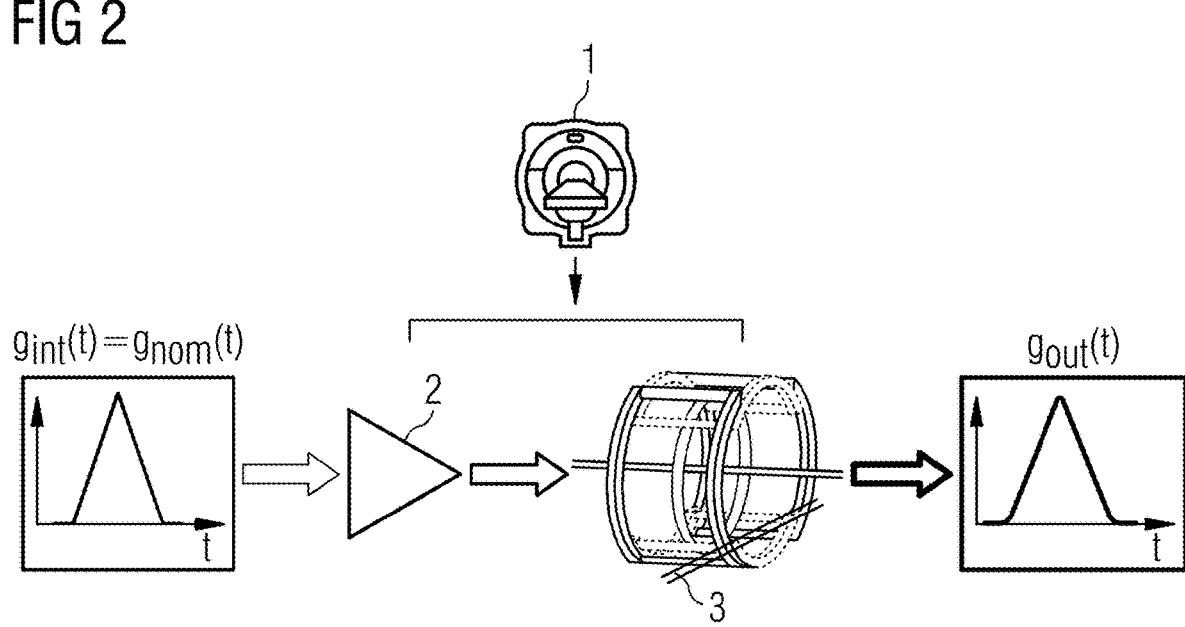
FIG. 2 depicts a schematic view of an MR system for explanation of the occurrence of the deviations from a target gradient of a magnetic field gradient created by the MR system according to an embodiment.

FIG. 2 depicts a schematic view of an MR system 1 for explanation of the occurrence of the deviations from a target gradient $g_{in}(t)=g_{nom}(t)$ of a magnetic field gradient $g_{out}(t)$ created by the MR system 1.

In an embodiment the trained function may determine an estimation for a magnetic field gradient created (emitted) by the MR system 1. In this case, for example a form and/or shape and/or a time characteristic of a magnetic field gradient may be estimated, i.e. for example in the form of time-dependent values. With the aid of the estimation for the magnetic field gradient created by the MR system 1 a gradient characterization function may be determined.

The trained function may take account of diverse peripheral conditions, such as gradient forms, temperature dependencies, gradient strengths (measured in millitesla per meter for example) or the like.

Figure 3:
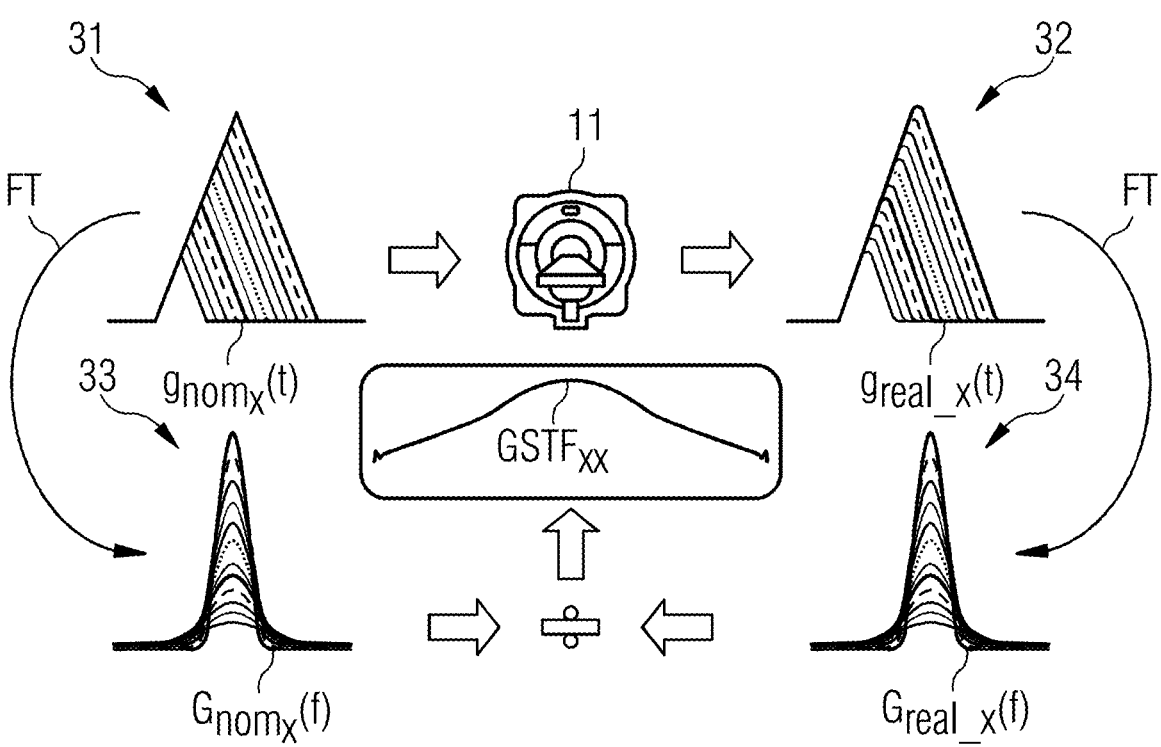
FIG. 3 depicts a schematic diagram for explanation of the computation of a gradient characterization function according to an embodiment.

FIG. 3 depicts a schematic diagram for explanation of the computation of a gradient characterization function. In this case various time characteristics 31 of nominal gradients $g_{nom\_x}(t)$, i.e., of target gradient, as well as the associated time characteristics 32 of the actually emitted magnetic field gradient $g_{real\_x}(t)$ are illustrated. The nominal magnetic field gradient $g_{nom\_x}(t)$, that in FIG. 3, by way of example, includes a triangular shape, is created in this case by a control facility of the MR system 1 and transferred to a scanner 11 of the MR system 1. The actually emitted magnetic field gradient $g_{real\_x}(t)$, because of noise effects, exhibits deviations from the triangular shape. For example, the corners are slightly rounded by comparison with the nominal magnetic field gradient $g_{nom\_x}(t)$.

Plotted in the lower part of FIG. 3 are the frequency spectra 33, 34 of the nominal magnetic field gradients $G_{nom\_x}(f)$ obtained by a Fourier transform FT and also the associated emitted magnetic field gradients $G_{real\_x}(f)$. With the aid of the frequency spectra $G_{nom\_x}(f)$ and $G_{real\_x}(f)$ a gradient characterization function $GSTF_{xx}$ may be computed. This will be explained in greater detail below.

The gradient impulse response function (GIRF) or its Fourier transform, the gradient system transmission function (GSTF) are gradient characterization functions that describe the transmission characteristics of the MR system 1 in a simplified manner and make possible the correction of distorted trajectories resulting from inadequacies of the gradient system. Mathematically the relationship between GIRF and GSTF may be described as follows:

$$GIRF = FT^{-1} GSTF,$$

wherein $FT^{-1}$ refers to the inverse Fourier transform.

The MR imaging system is tested with test-magnetic field gradients (i.e. test signals or input magnetic field gradients), for example rectangular pulses, triangular pulses or chirped pulses. To this end an initial magnetic field gradient is measured for various test magnetic field gradients. This is undertaken by measurement in a specific measurement object, for example a phantom (in thin slice methods) or a dynamic field camera. The first order GSTF may be computed for example for the x-gradient axis (k=1=x) as the sum of the initial gradient $$G_{out}^i(f)$$

divided by the sum of the input gradients $$G_{nom}^i(f)$$

$$GSTF_{k,l}(f) = \frac{\sum_{i=1}^{i=N} G_{in_k}^{+i}(f) \cdot G_{out_l}^i(f)}{\sum_{i=1}^{i=N} \left| G_{in_k}^i(f) \right|^2}.$$

This equation describes the behavior of the gradient system, i.e. of the amplifier and the gradient coil(s), however not exactly. A possible reason for deviations may for example exhibit a non-linear behavior and/or a temporal change of the behavior (for example as a result of aging effects) for example of electronic components of the amplifier.

Such deviations may be taken into account and compensated for by the use of the trained function.

The trained function may be trained to determine the GSTF directly, for example by learning from input data and the computed GSTF. Thus, the GSTF is determined by the trained function. The GSTF may quickly be determined by the trained function and it is made easier to take account of peripheral conditions, such as for example the influence of the temperature or the influence by the patient.

In an embodiment the GSTF is determined with the aid of magnetic field gradients estimated by the trained function. A field camera for measurement of the magnetic field gradient is thereby no longer necessary. Learning by the trained function in medical operation may further be made significantly easier by this.

In an embodiment the trained function estimates the gradient characterization function and may also learn non-linear behavior, temporally-related changes and/or aging effects.

Then, with aid of the gradient characterization function, a corrected amplifier input signal or a correction signal for correction of the amplifier input signal may be created. The corrected amplifier input signal is then applied to the amplifier 2. This involves a pre-emphasis, i.e. the correction is already undertaken at the level of the created amplifier input signal and not only by correction of the already created data.

The pre-emphasis is especially advantageous since the target gradient impulse is obtained at the output of the gradient system or the gradient coil 3. For specific sequences and pulse types a pre-emphasis may only serve to correct deviations of the magnetic field gradients.

The correction signal may be created in the sense of a method of regulation, i.e., be combined with an already created amplifier input signal in order to compensate for deviations. The deviations may be corrected by the pre-emphasis in such a way that the actually created magnetic field gradient corresponds to the target gradient as well as possible.

The gradient system with the gradient coil 3 may include a Digital Signal Processor (DSP), a Field Programmable Gate Array (FPGA) or a similar unit, that is configured so that it adjusts the amplifier input signal in real time.

Post-correction methods are likewise possible. In the methods the GSTF may be used to correct image distortions during the image reconstruction.

Figure 4:
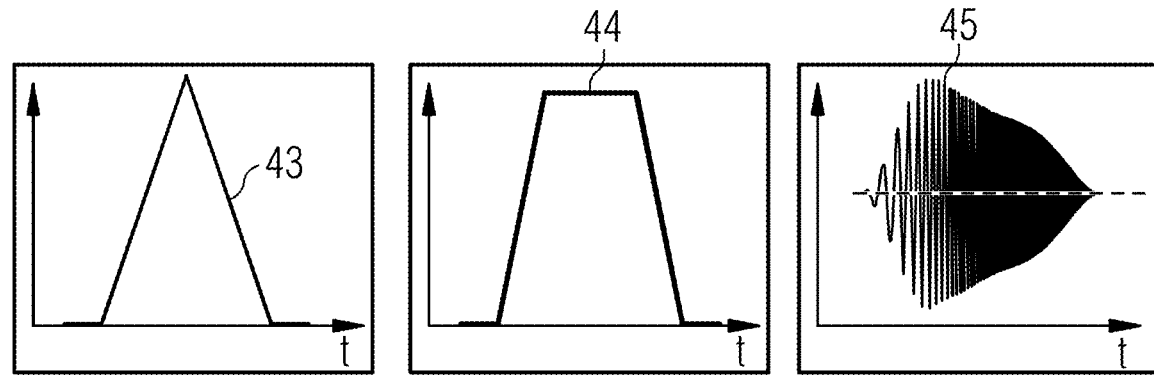
FIG. 4 depicts examples of time characteristics of test pulses according to an embodiment.

FIG. 4 depicts examples of time characteristics of test pulses, that may be used for training the function. The test pulses in this case are magnetic field gradients, that may be used for training the trained function. The test pulses in this case may also be magnetic field gradients in regular medical operation.

Different sets of test pulses may serve to train a general representation of any given imaging pulses. Triangular pulses 43, rectangular pulses or trapezoidal pulses 44 and chirped pulses 45 may be used for these test pulses for example. In such cases parameter sets may be varied, such as pulse width, amplitude and slew rate. Preferably a broad frequency spectrum (for example 0-100 kHz) with a high spectral intensity is covered. With this selection of test pulses it may be ensured that the trained algorithm learns how the MR system 1 transmits the different frequency components from which all conventionally used imaging gradients are composed. Ideally all possible frequencies that may be transmitted are tested.

In an embodiment the training dataset contains many pairs of nominal and real emitted (distorted) magnetic field gradients under various peripheral conditions, such as for example different temperatures, but also various durations and/or sequences of magnetic field gradients.

Figure 5:
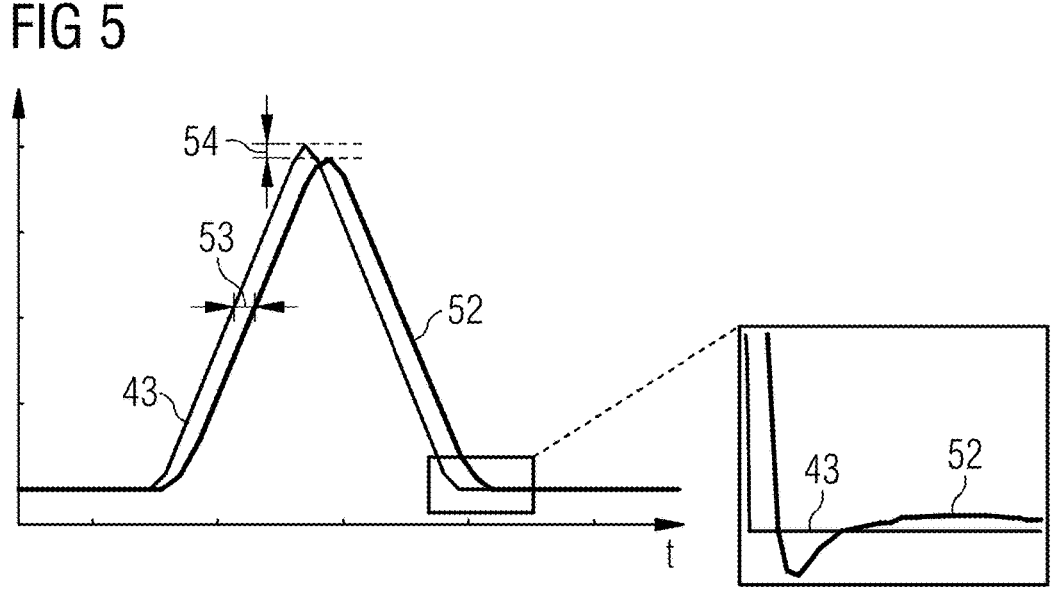
FIG. 5 depicts an example of a deviation from the triangular waveform of the target gradient shown in FIG. 4 of a magnetic field gradient created by the MR system according to an embodiment.

FIG. 5 depicts an example of a deviation from the triangular-shaped waveform of the target gradient 43 also shown in FIG. 4 of a magnetic field gradient 52 created by an MR system 1. In this case a signal transmission reduction 54 occurs. There is further a signal delay 53.

Figure 6:
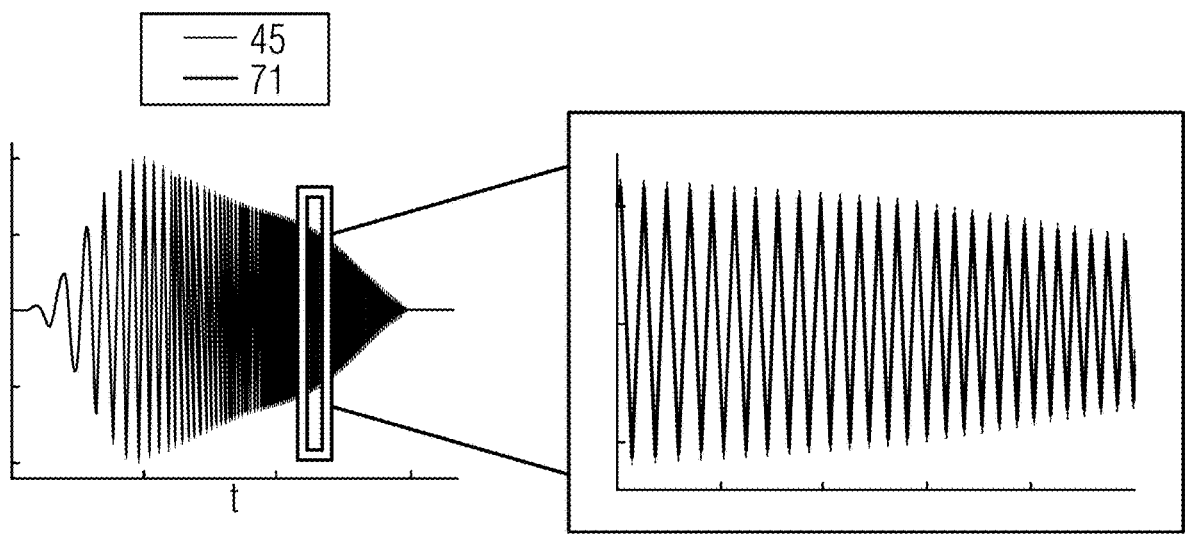
FIG. 6 depicts an example of a deviation from the chirped pulse-like time characteristic of the target gradient shown in FIG. 4 of the magnetic field gradient created by an MR system according to an embodiment.

FIG. 6 depicts an example of a deviation from the chirped pulse-like time characteristic of the target gradient 45 shown in FIG. 4 of a magnetic field gradient 71 created by an MR system 1.

During the imaging the amplifier 2 and the gradient coil 3 may heat up, for example when longer working cycles and/or high slew rates are used. The temperature state in the gradient coil 3 and/or the amplifier 2 may be measured by various temperature sensors, that may be integrated into the gradient system. As an alternative the temperature state or temperature changes may also be modeled by the complex resistance of the system. The temperature states may be incorporated into the training dataset, for example by emulating image gradients for various temperature states.

In an embodiment the training data may also contain the amplifier input signal $i_{in}$, the amplifier output signal $i_{out}$, but also information about the diagnostically relevant region of the patient's body as well as about the patient themself, that may interfere with the magnetic gradient field of the emitted magnetic field gradients and thus introduce interference effects. There may further be provision, for the trained function to have access to real time measured values (or computed values) of these parameters, in order to make possible a real time or an advance compensation for interference effects during an MR measurement of a patient.

Figure 7:
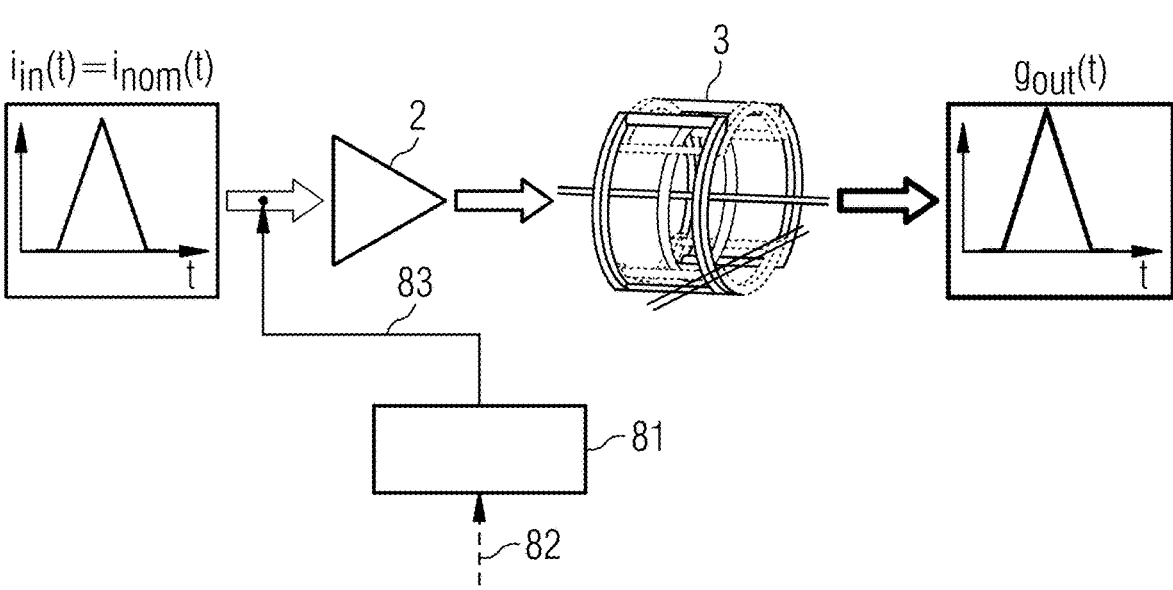
FIG. 7 depicts a schematic block diagram for explanation of the use of a trained function for reducing and/or correcting deviations from a target gradient of a magnetic field gradient created by an MR system according to an embodiment.

FIG. 7 depicts a schematic block diagram for explanation of the use of a trained function 81 for reducing and/or correcting deviations from a target gradient of a magnetic field gradient created by an MR system 1. The trained function is configured so that it adjusts an input signal 83 to the amplifier 2 as a function of a target gradient $g_{nom}(t)$, that may be an input signal 82 of the trained function 81. The input signal 82 of the trained function 81 may also include a measured emitted magnetic field gradient. Such a configuration is already well suited to compensating for deviations from the target gradient of the created magnetic field gradient because of linear and non-linear influences of the components involved, for example amplifier 2 and gradient coil 3. This applies for example in cases in which temperature effects may be or have to be ignored, as is the case in the lowest-cost systems or with extremely fast cycles.

Figure 8:
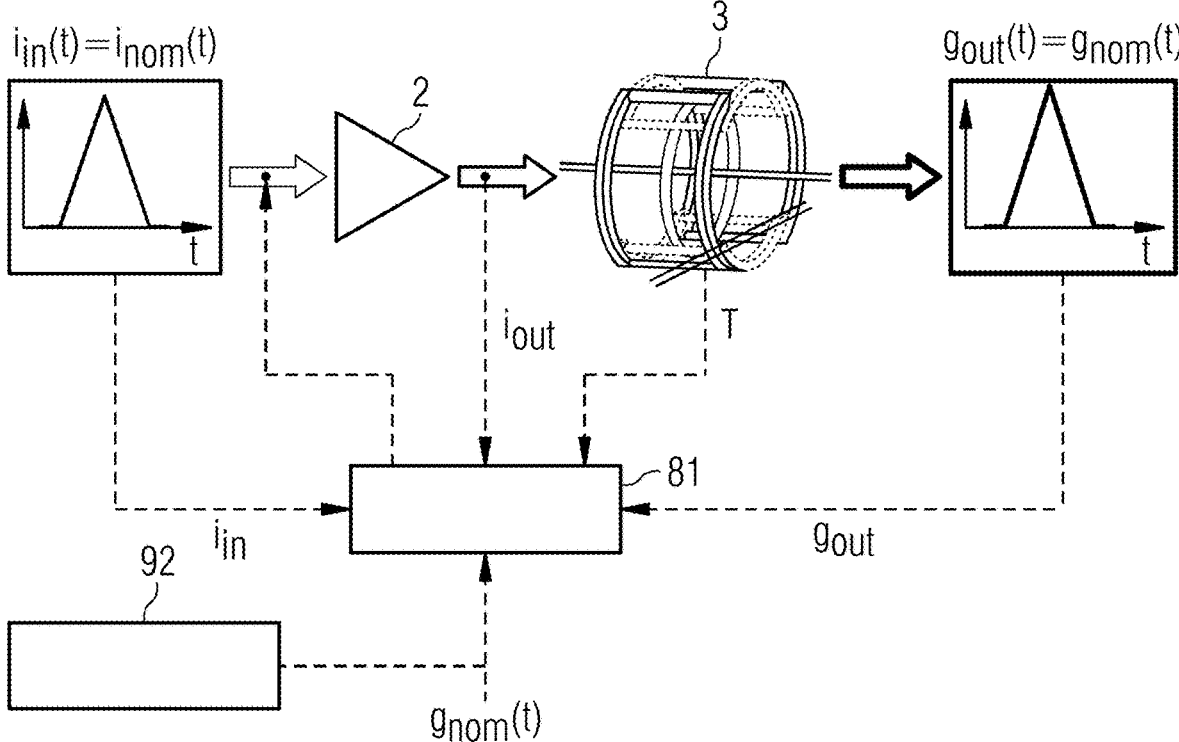
FIG. 8 depicts a schematic block diagram for explanation of the use of a trained function for reducing and/or correcting deviations from a target gradient of a magnetic field gradient created by an MR system according to an embodiment.

FIG. 8 depicts a schematic block diagram for explanation of the use of a trained function 81 for reducing and/or correcting deviations from a target gradient of a magnetic field gradient created by an MR system 1 in accordance with an embodiment. In this case the trained function 81 is configured so that the trained function 81 corrects the amplifier input signal $i_{out}$ in the amplifier as a function of various parameter, for example a temperature T of the gradient coil and patient information 92, such as measurements or weight of the patient. The trained function 81 may further receive an amplifier output signal $i_{out}$ and a measured emitted magnetic field gradient $g_{out}$ as its input.

The trained function 81 may for example be trained to recognize or to identify the desired target gradient with the aid of the output signal of the amplifier 2, so that a correction described above may be carried out.

There may further be provision for the trained function 81 to be able to directly determine with the aid of the output signal of the amplifier 2 a deviation from the target gradient and/or be able to determine a corresponding correction.

The trained function 81 may also determine the desired target gradient with the aid of the input signal of the amplifier 2.

The input signal 82 to the trained function 81 may also be any given information with the aid of which the target gradient is able to be identified, for example as a numeric value, a string, a tuple, or packed as any other given data structure. The input signal 82 may also be an analog signal, such as the input current of the amplifier 2.

Figure 9:
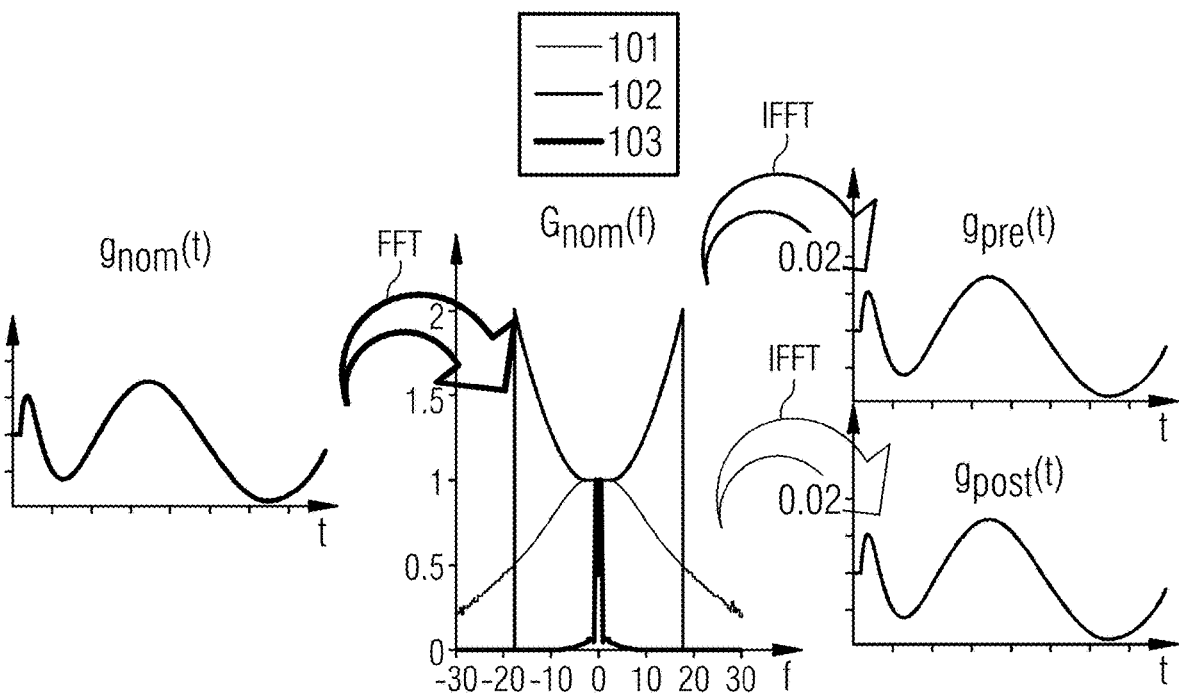
FIG. 9 depicts examples of diagrams of the reduction and/or correction of deviations from a target gradient of a magnetic field gradient created by an MR system for a specific time characteristic of the target gradient according to an embodiment.

FIG. 9 depicts examples of diagrams for the reduction and/or correction of deviations from a target gradient of a magnetic field gradient created by an MR system 1 for a specific time characteristic of the target gradient. The time characteristic here is spiral-shaped. Shown are the target gradient $g_{nom}(t)$, the frequency representation 103 of the target gradient $G_{nom}(f)$ obtained by the Fourier transform FFT and also the frequency representation 101 of the GSTF and the frequency representation 102 of the inverse GSTF.

In post-correction the frequency representation 103 of the target gradient $G_{nom}(f)$ is multiplied by the GSTF before the result is transformed back into the time area. In pre-emphasis the frequency representation 103 of the target gradient $G_{nom}(f)$ is multiplied by the frequency representation 102 of the inverse GSTF. The time characteristics $g_{pre}(t)$ and $g_{post}(t)$ obtained by inverse FFT in pre-emphasis or post-correction are essentially identical.

Figure 10:
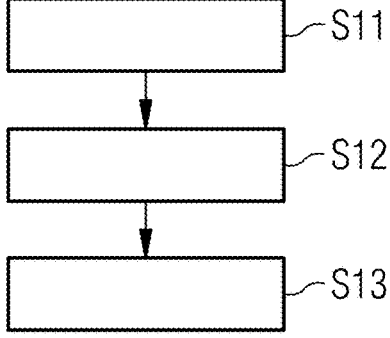
FIG. 10 depicts a flow diagram of a method for reducing and/or correcting deviations from a target gradient of a magnetic field gradient created by an MR system in according to an embodiment.

FIG. 10 depicts a flow diagram of a method for reducing and/or correcting deviations from a target gradient of a magnetic field gradient created by an MR system. The method may for example be carried out with the apparatus 4 described in FIG. 1.

In this figure, in a step S11, input data is provided for a trained function provided by a machine-learning algorithm. The input data includes information about the target gradient of the MR system 1. The information about the target gradient may for example involve a designation of the target gradient (for example a numerical value, string or an identifier in any given data format), the amplifier input signal or amplifier output signal or the like. The information about the target gradient may include a time characteristic of the target gradient, a frequency of the target gradient, a pulse width of the target gradient, and/or a slew rate of the target gradient.

The trained function 81 (the trained algorithm) may include a neural network, for example a multilayer neural network ("deep learning") or a convolutional neural network. Various techniques, for example supervised learning, unsupervised learning or reinforced learning, may be employed for the training of the trained algorithm. Over and above this an approach based on Delta rules, a backpropagation algorithm or a Stochastic Gradient Descent (SGD) method may be used, for example for computation of the magnetic field gradients of loss functions with regard to the weights of the network.

In a further step S12 output data is created by the trained function with the aid of the input data. The trained function may include various layers with respective neurons. The weights of the neurons are learned during training in such a way that the trained function is in a position to create output data, that may be used for reduction and/or correction of the deviations.

In a step S13 deviations from the target gradient of the magnetic field gradients created by the MR system are corrected and/or reduced with the aid of the output data created.

Figure 11:
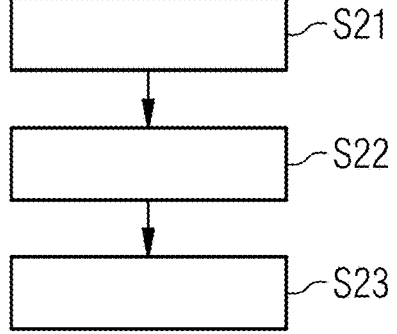
FIG. 11 depicts a flow diagram of a computer-implemented method for creation of a trained function according to an embodiment.

FIG. 11 depicts a flow diagram of a computer-implemented method for creation of a trained function.

In a first step S21 training data is provided, that includes at least one target gradient of an MR system 1 with associated magnetic field gradient actually created by the MR system 1. The training data may include for a pair including of a target gradient and an associated magnetic field gradient actually created by the MR system 1, at least one of the signals or data that has been described in conjunction with FIG. 1 as input data of the trained function 81. Through this the respective dependencies are trained as well. The trained function 81 is then in a position to take the dependencies into account.

In a second step S22 the function is trained by a machine-learning algorithm. In this case the training data is included. The function 81 is trained to output output data, that is able to be used for reducing and/or correcting deviations from the target gradient by magnetic field gradients created by the MR system 1.

In an embodiment the trained function 81 is created in such a way that, with the aid of the trained function 81, an estimation for a magnetic field gradient created by the MR system 1 may be determined. With the aid of the estimation for the magnetic field gradient created by the MR system 1 a gradient characterization function may be determined. With the aid of the gradient characterization function a corrected amplifier input signal or a correction signal for correction of the amplifier input signal may be created, for example for pre-emphasis.

As an alternative the trained function 81 is created in such a way that MR image data may be created, i.e., for post-correction, with the aid of raw data, that is created by the MR system 1 by the created magnetic field gradient and with the aid of the gradient characterization function.

The training data may include information about the target gradient of the MR system 1 and associated magnetic field gradient actually created by the MR system 1 for a plurality of different temperatures of at least one component of the MR system 1, different frequencies, different pulse widths, different amplitudes and/or different slew rates.

In a further step S23 the trained function 81 is provided. To this end the trained function 81 may be stored in a memory unit or may be carried out from the memory unit.

Figures 12, 13:
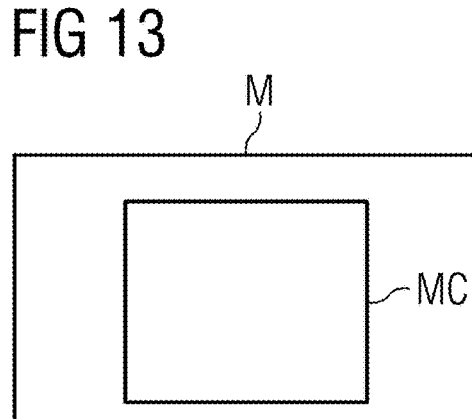
FIG. 12 depicts a schematic block diagram of a computer program product in according to an embodiment.
FIG. 13 depicts a schematic block diagram of a non-volatile, computer-readable memory medium according to an embodiment.

FIG. 12 depicts a schematic block diagram of a computer program product P with executable program code PC. The executable program code PC is configured, when executed on a computer, to carry out one of the methods described above.

FIG. 13 depicts a schematic block diagram of a non-volatile, computer-readable memory medium M with executable program code MC, configured, when executed on a computer, to carry out one of the methods described above.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that the dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for reducing, correcting, or reducing and correcting deviations from a target gradient of a magnetic field gradient created by a magnetic resonance (MR) system, the method comprising:

providing input data for a function trained by a machine-learning algorithm, wherein the input data comprises information about the target gradient of the MR system;

determining an estimation for the magnetic field gradient by the trained function when input the input data;

determining a gradient characterization function is determined using the estimation for the magnetic field gradients;

creating a corrected amplifier input signal or a correction signal for correction of an amplifier input signal using the gradient characterization function; and applying the corrected amplifier input signal to an amplifier of the MR system, wherein the deviations from the target gradient of the magnetic field gradient created by the MR system are reduced, corrected, or reduced and corrected by applying the corrected amplifier input signal.

2. The method of claim 1, wherein the MR system comprises the amplifier that is configured to amplify the amplifier input signal and output an amplifier output signal, and wherein the MR system further comprises a gradient coil that is configured to create the magnetic field gradient using at least the amplifier output signal; wherein the trained function determines the corrected amplifier input signal or a correction signal for correction of the amplifier input signal; and wherein the amplifier output signal is created as a function of the corrected amplifier input signal or of the correction signal.

3. The method of claim 1, wherein the input data for the trained function further comprises at least one of:

the amplifier input signal of the amplifier of the MR system, wherein the amplifier amplifies the amplifier input signal and outputs it as an amplifier output signal to a gradient coil of the MR system, which creates the magnetic field gradient using the amplifier output signal, the measured amplifier output signal, at least one measured temperature of the amplifier, of the gradient coils, or of the amplifier and the of the gradient coils, a measured magnetic field gradient created by the MR system, a diagnostically relevant imaging region, or information regarding an object being examined by the MR system.

4. A computer-implemented method for creation of a trained function, the method comprising:

providing training data, the training data comprising at least one item of information about a target gradient of a magnetic resonance (MR) system with associated magnetic field gradient created by the MR system;

training a function using a machine-learning algorithm, based on the training data, wherein the function is trained to output output data that is able to be used for reducing, correcting, or reducing and correcting deviations from the target gradient of magnetic field gradients created by the MR system;

determining an estimation for a magnetic field gradient created by the MR system using the trained function;

determining a gradient characterization function using the estimation for the magnetic field gradient created by the MR system; and creating, using the gradient characterization function, a corrected amplifier input signal or a correction signal for correction of an amplifier input signal or creating MR image data using raw data that is created by the MR system by the magnetic field gradient and is created using the gradient characterization function.

5. The method of claim 4, wherein the training data comprises information about at least one of the target gradient of the MR system and associated magnetic field gradients created by the MR system for a plurality of different temperatures of at least one component of the MR system, different frequencies, different pulse widths, different amplitudes, or different slew rates.

6. The method of claim 4, wherein the training data for a pair consists of the target gradient and an associated magnetic field gradient created by the MR system, wherein the training data further comprises at least one of an amplifier input signal of an amplifier of the MR system, wherein the amplifier amplifies the amplifier input signal and outputs an amplifier output signal to gradient coils of the MR system that create the magnetic field gradient using the amplifier output signal, the amplifier output signal, at least one measured temperature of the amplifier, of the gradient coils, or of the amplifier and the gradient coils, a measured magnetic field gradient created by the MR system, an image region, or information related to an object being examined by the MR system.

7. An apparatus for reducing, correcting, or reducing and correcting deviations from a target gradient of a magnetic field gradient created by a magnetic resonance (MR) system, the apparatus comprising:

a computing facility configured to provide input data to a trained function trained by a machine-learning algorithm, wherein the input data comprises information about the target gradient of the MR system, and to create output data by the trained function when input the input data, wherein the trained function is configured to determine an estimation for the magnetic field gradient created by the MR system, wherein the computing facility is further configured to determine a gradient characterization function using the estimation for the magnetic field gradients created by the MR system; and a reduction/correction facility configured using the output data of the trained function to create MR image data using raw data created by the MR system and the gradient characterization function to reduce, correct, or reduce and correct deviations from the target gradient of the magnetic field gradient created by the MR system.

8. The apparatus of claim 7, wherein the MR system comprises:

an amplifier configured to amplify an amplifier input signal and to output an amplifier output signal; and a gradient coil configured to create the magnetic field gradient using the amplifier output signal.

*    *    *    *    *